United States Patent [19]

Kitamura et al.

[11] Patent Number: 5,604,443
[45] Date of Patent: Feb. 18, 1997

[54] PROBE TEST APPARATUS

[75] Inventors: Yoshisuke Kitamura; Munetoshi Nagasaka, both of Yamanashi-ken, Japan

[73] Assignees: Tokyo Electron Limited, Tokyo; Tokyo Electron Yamanashi Limited, Nirasaki, both of Japan

[21] Appl. No.: 448,264

[22] Filed: May 23, 1995

[30] Foreign Application Priority Data

May 23, 1994 [JP] Japan .................................. 6-108485
May 24, 1994 [JP] Japan .................................. 6-109433
Dec. 2, 1994 [JP] Japan .................................. 6-299308

[51] Int. Cl.$^6$ ..................................................... G01R 1/04
[52] U.S. Cl. ........................................... 324/754; 414/416
[58] Field of Search ........................... 324/754, 765, 324/760, 757, 758, 756, 96; 414/416, 786

[56] References Cited

U.S. PATENT DOCUMENTS 4,775,281 10/1988 Prentakis .
4,901,011 2/1990 Koike et al. .
5,278,494 1/1994 Obigane .

FOREIGN PATENT DOCUMENTS 4-340250 11/1992 Japan .

*Primary Examiner*—Kenneth A. Wieder
*Assistant Examiner*—Barry C. Bowser
*Attorney, Agent, or Firm*—Oblon, Spivak, McClelland, Maier & Neustadt, P.C.

[57] ABSTRACT

A probe test apparatus comprising a test section for testing a wafer, a cassette having an opening at one side through which the wafer is taken into and out of the cassette, grooves formed in inner faces of both sides of the cassette to hold wafers therein, and a convex member projected downward from the underside of the cassette, a stage on which the cassette is mounted keeping the wafers therein substantially horizontal, and holder members projected upward from the top of the cassette-mounted stage and having a recess into which the convex member of the cassette falls, wherein when the convex member is not fitted into the recess but contacted with the holder members, the wafers in the cassette are tilted and when it is fitted into the recess, they can be kept substantially horizontal in the cassette to thereby position the cassette relative to the test section.

19 Claims, 10 Drawing Sheets

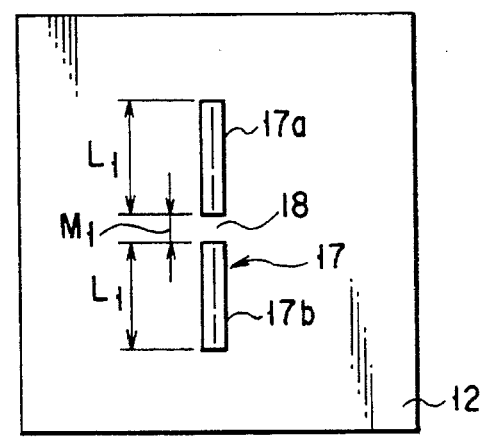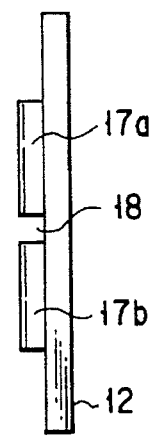
F I G. 3A   F I G. 3B
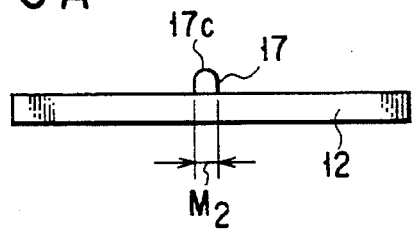
F I G. 3C
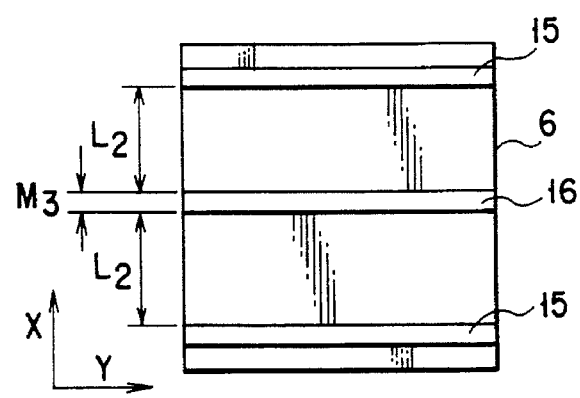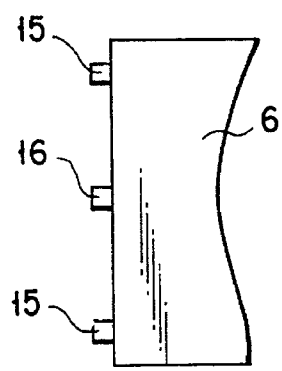
F I G. 4A   F I G. 4B
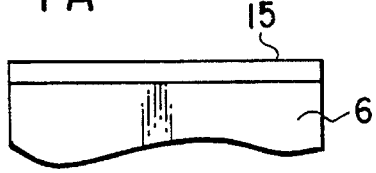
F I G. 4C

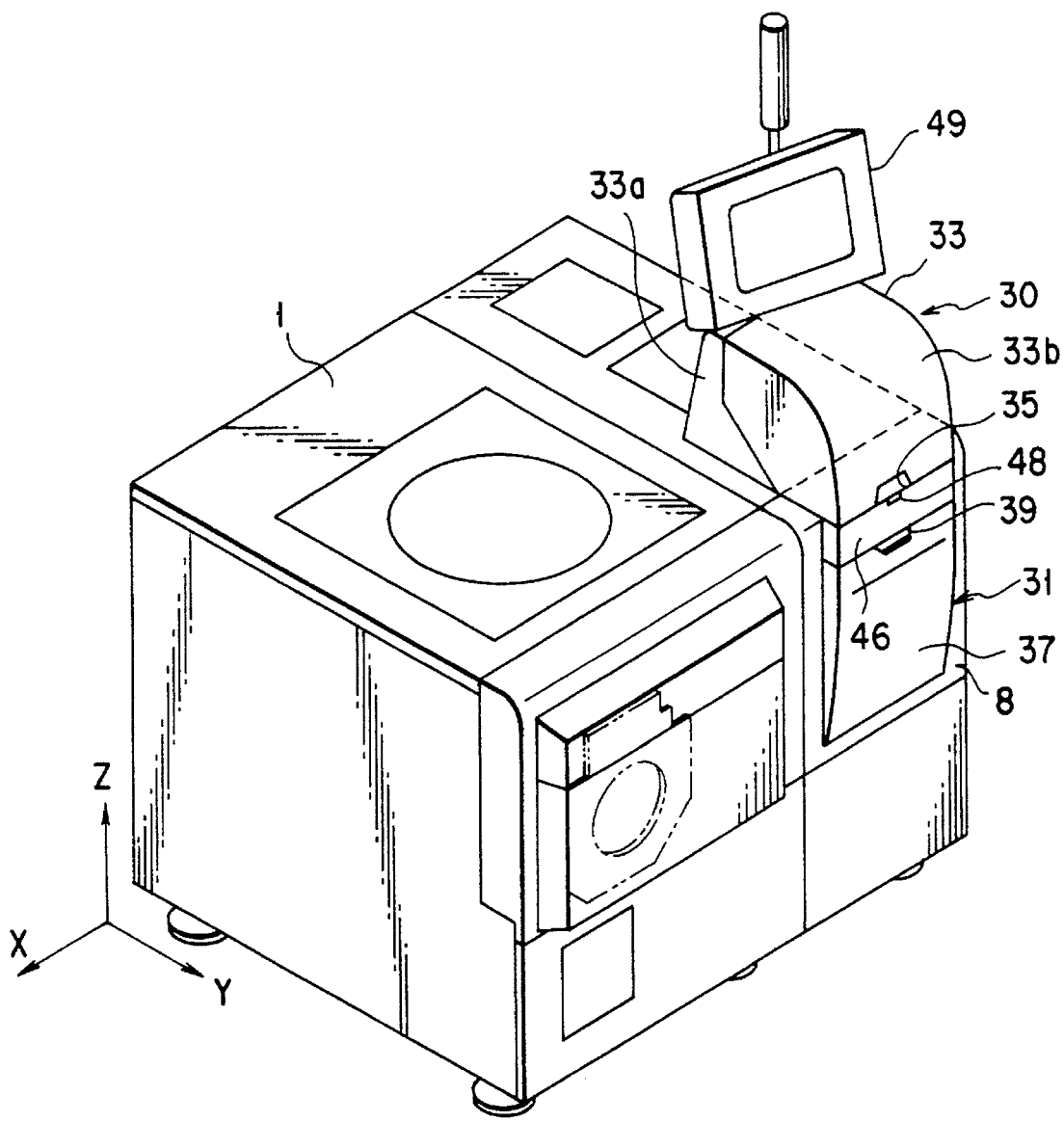
F I G. 8

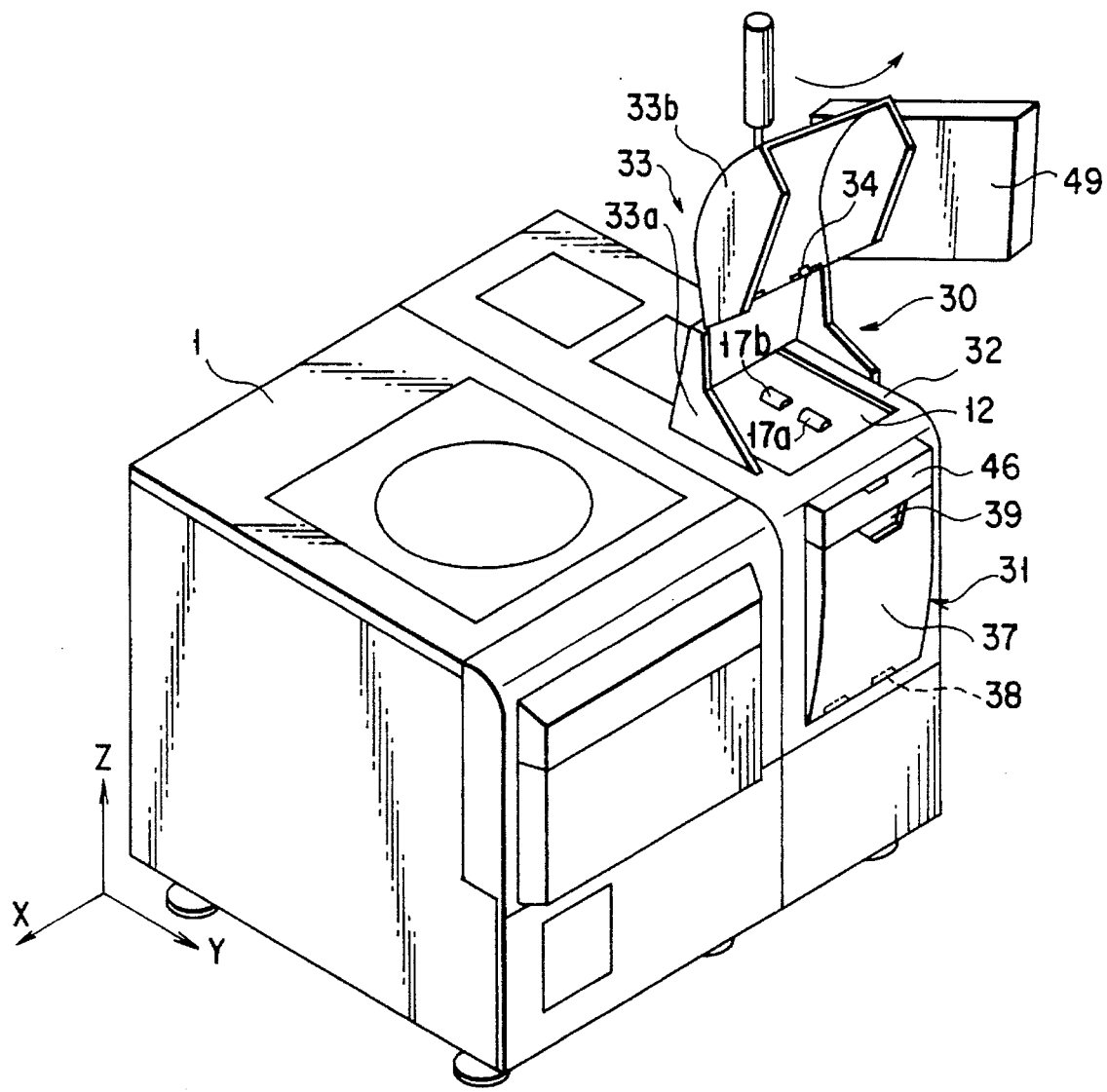
F I G. 9

PROBE TEST APPARATUS

BACKGROUND OF THE INVENTION

1. Field of the Invention

The present invention relates to a probe test apparatus for measuring electric properties of an object such as the semiconductor device to be checked.

2. Description of the Related Art

In the conventional probe test apparatus, a wafer cassette is mounted on a cassette-mounted stage in such a way that its wafer take-in and -out opening faces the rear side of the apparatus, when the operator sets it on the stage by his hands. When it is not positioned at its correct area on the cassette-mounted stage, the correct holding of a wafer W may not be attained or the wafer W may be damaged upon taking the wafer W into and out of it. This is the reason why it must be positioned at its correct area on the cassette-mounted stage. However, the cassette-mounted stage is enclosed by side plates of the apparatus itself and the operator cannot therefore see and confirm the stage by his eyes. This makes it difficult for the operator to position it at its correct area on the stage.

Further, wafers having 6 and 8-inch diameters are commonly checked by one probe test apparatus in the conventional cases. It is therefore needed to previously confirm which of them is to be checked. The conventional wafer size detector section is arranged not on the passage through which the wafer W is carried from the cassette to a wafer-mounted stage, but at a different place. When the size of a wafer W is to be detected, therefore, a pincette of the load/unload unit must be swung to position the wafer W at the wafer size detector section. This means that the load/unload unit needs another drive shaft for swinging the pincette, in addition to a drive shaft for linearly forwarding and retreating it to take the wafer W into and out of the cassette. The load/unload unit, therefore, becomes complicated, comprising a combination of two drive shafts. In addition, the cycle time during which the wafer W is taken into and out of the cassette is long in the conventional probe test apparatus.

SUMMARY OF THE INVENTION

An object of the present invention is therefore to provide a probe test apparatus for enabling the operator to more easily mount the cassette on the cassette-mounted stage, to more reliably position it at its correct area on the stage and to more easily confirm by his eyes whether or not it is correctly positioned on the stage.

Another object of the present invention is to provide a probe test apparatus, simpler in the arrangement and shorter in the cycle time, and capable of detecting the size of a wafer on the passage through which the wafer is carried from the cassette to the wafer-mounted stage.

A probe test apparatus according to the present invention comprises a test section for testing a substrate; a cassette having an opening at one side through which the substrate is taken into and out of the cassette, grooves formed in inner faces of both sides of the cassette to hold substrates therein, and a convex portion projected downward from an underside of the cassette; a stage on which the cassette is mounted keeping the substrates therein substantially horizontal; and holder means projected upward from a top of the cassette-mounted stage and having a recess into which the convex portion of the cassette falls; wherein when the convex portion is not fitted into the recess but contacted with the holder means, substrates in the cassette are tilted, and when it falls in the recess, the substrates are kept substantially horizontal in the cassette to thereby position the cassette relative to the test section.

A probe test apparatus according to the present invention comprises a test section for testing a substrate; load means for taking the substrate, which is to be tested, out of a cassette; a sensor having an optical axis crossing a space through which the substrate taken out by the load means passes; calculating means for calculating the size of the substrate responsive to light detection signal applied from the sensor; alignment means for positioning the substrate relative to the test section on the basis of the substrate size calculated; and unload means for returning the substrate, which has been tested, from the test section into the cassette.

A probe test apparatus according to the present invention comprises a test section for testing a substrate; load means for taking the substrate, which is to be tested, out of a cassette; a first sensor having an optical axis crossing a space through which the substrate taken out by the load means passes; operational means for calculating the size of the substrate responsive to light detection signal applied from the first sensor; alignment means for positioning the substrate relative to the test section on the basis of the substrate size calculated; unload means for returning the substrate, which has been tested, from the test section into the cassette; and a second sensor having an optical axis crossing just before the cassette opening, through which the substrate is loaded into and unloaded from the cassette, to detect any of the substrates coming out of the cassette.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 3A is a plan view showing the cassette-mounted stage of the first probe test apparatus;

FIG. 3B shows the cassette-mounted stage of the first probe test apparatus viewed in the direction of an axis Y;

FIG. 3C shows the cassette-mounted stage of the first probe test apparatus viewed in the direction of an axis X;

FIG. 4A is a plan view showing an underside of the wafer cassette of the first probe test apparatus;

FIG. 4B shows the underside of the wafer cassette viewed in the direction of the axis Y;

FIG. 4C shows the underside of the wafer cassette viewed in the direction of the axis X;

FIG. 8 is a perspective view showing the probe test apparatus according to a second embodiment of the present invention;

FIG. 9 is a perspective view intended to explain how the second probe test apparatus is operated;

DETAILED DESCRIPTION OF THE PREFERRED EMBODIMENTS

Figure 1:
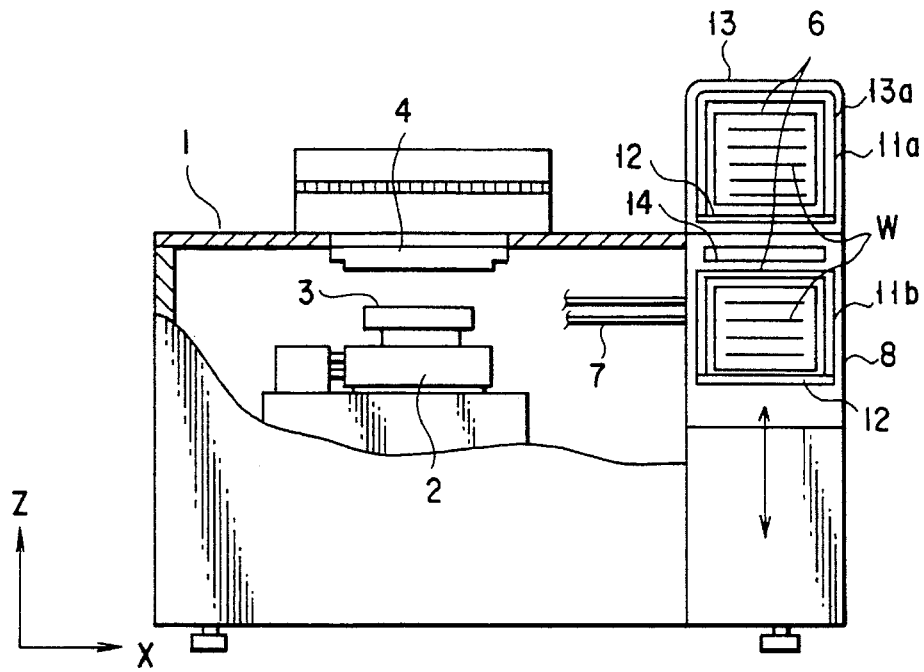
FIG. 1 is a partly-sectioned view showing the probe test apparatus according to a first embodiment of the present invention.

Referring to FIGS. 1 through 7, the probe test apparatus according to a first embodiment of the present invention will be described at first.

The probe test apparatus 1 is covered on its top by a cover 13 but except that area thereof to which a probe card unit 4 is attached. The probe card unit 4 has a plurality of probes. Each probe is connected to the signal transmission circuit of a test head and test signal is applied from a tester (not shown) to each probe through the test head.

A main stage 2 is arranged in a body of the probe test apparatus 1. A wafer stage 3 on which a semiconductor wafer is mounted is arranged on the main stage 2. The main stage 2 has an X-Y-Z-θ carrier unit, which carries or moves the wafer stage 3 in directions of axes X, Y and Z and swings it in a direction θ.

Two upper and lower cassette holders 11a and 11b are arranged on one side of the probe test apparatus 1 and each of them has a cassette-mounted stage 12. Each cassette-mounted stage 12 is moved up and down by a lifter unit (not shown). A wafer cassette 6 in which plural wafers are housed is mounted on each cassette-mounted stage 12.

The upper cassette holder 11a is projected upward from the top of the apparatus 1 and covered on its whole by the cover 13. The cover 13 has an opening 13a on the front side of the apparatus 1 through which the cassette 6 is taken into and out of the upper cassette holder 11a. The lower cassette holder 11b is arranged in the body of the apparatus 1 and positioned just under the upper one 11a. The lower cassette holder 11b is enclosed by side plates 8 and an opening through which the cassette 6 is taken into and out of it is formed in the side plate 8 facing the front side of the apparatus 1.

When the cassette 6 in which wafers W to be tested are housed is to be mounted on the cassette-mounted stage 12, the operator takes the cassette 6 into the apparatus 1 through the opening 13a and mounts it on the cassette-mounted stage 12. When the cassette 6 in which tested wafers W are housed is to be demounted from the stage 12, he puts his hand into the apparatus 1 through the opening 13a and lifts the cassette 6 from the stage 12 by his hand.

Further, a test wafer housing shelf 14 of the drawer type is arranged between the upper 11a and the lower cassette holder 11b. A wafer to be tested is housed in the test wafer housing shelf 14.

The wafer cassette 6 and the cassette-mounted stage 12 will be described referring to FIGS. 2 through 7.

Figure 2:
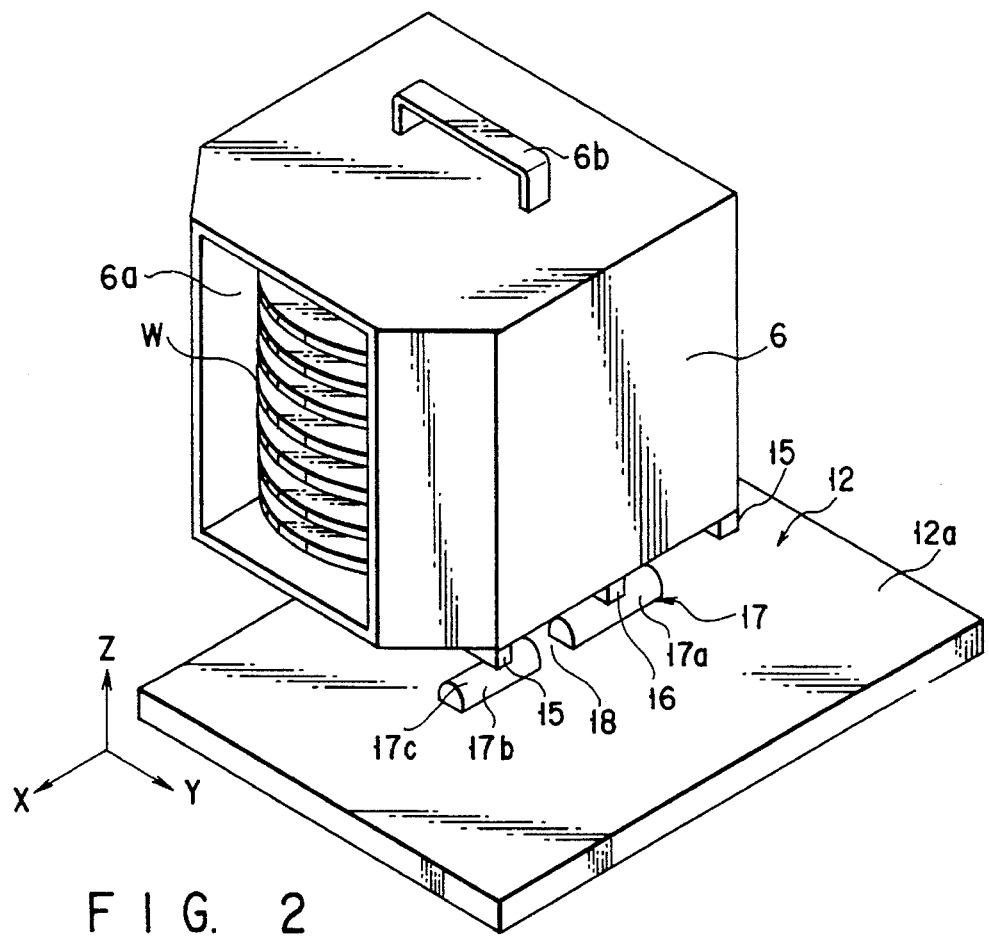
FIG. 2 is a perspective view showing a cassette-mounted stage and a wafer cassette of the first probe test apparatus.

As shown in FIG. 2, the wafer cassette 6 is shaped like a substantially rectangular box and made of synthetic resin. A cassette-mounted top 12a of the stage 12 has an area larger than the bottom of the cassette 6. The cassette 6 has an opening 6a in one side and the wafer W is taken into and out of the cassette 6 through the opening 6a. Plural parallel grooves are formed in inner faces of side walls of the cassette 6 and the wafers W are held in these grooves. The wafer cassette 6 used in the present invention can house fifty sheets of wafer W therein, maximum. A handle 6b is attached to the top of the cassette 6. Further, two legs 15 and a positioning member 16 are attached to the underside of the cassette 6.

As shown in FIGS. 3A through 3C, a holder means 17 is arranged on the top of the cassette-mounted stage 12. The stage 12 and the holder means 17 are made of metal such as aluminium and stainless steel. The holder means 17 includes two holder members 17a and 17b arranged in series on the top of the stage 12, extending on the center line thereof and along the axis X. The holder members 17a, 17b are separated from each other by a distance $M_1$ and an engaged recess 18 is formed between them. They have a same length $L_1$ and a same width $M_2$. The width $M_1$ of the engaged recess 18 is made a little larger than that $M_3$ of the positioning member 16. An upper portion 17c of each member 17a or 17b is made round. The members 17a, 17b may have a semi-circular, semi-elliptic or polygonal section.

As shown in FIGS. 4A through 4C, the positioning member 16 is attached to the underside of the cassette 6 on the center line thereof and two legs 15 are also attached there parallel to the positioning member 16. They are made integral to the cassette 6, extending from one side of the cassette 6 to the other opposite side thereof. They are shaped like a rectangular column and they, therefore, have a rectangular top. Each of legs 15 is separated from the positioning member 16 by a distance $L_2$. This distance $L_2$ is longer than that $L_1$ of each of the holder members 17a and 17b. The cassette 6 is mounted on the stage 12 with its members 15 and 16 extending along the axis Y. When it is mounted on the stage 12, therefore, its members 15 and 16 become perpendicular to the holder members 17a and 17b.

Figure 6:
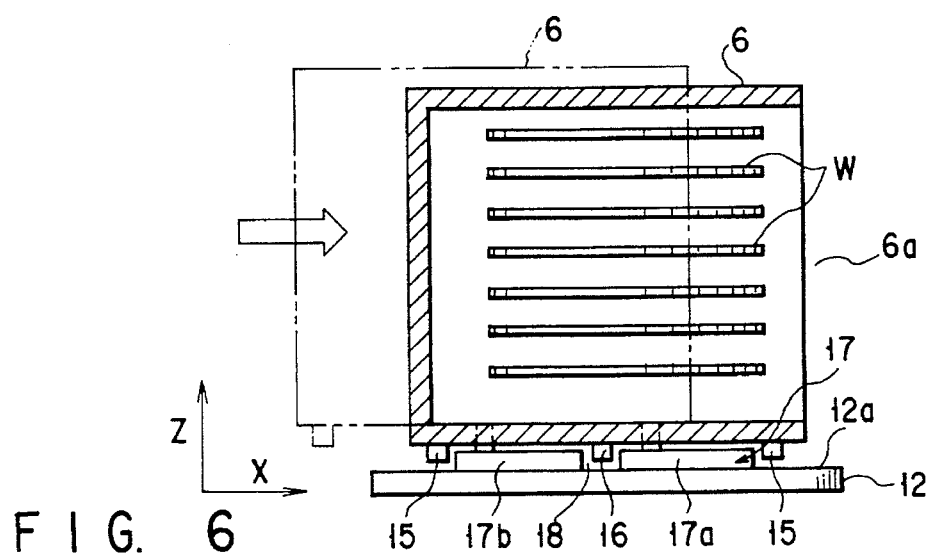
FIG. 6 is a perspective view showing the cassette-mounted stage and the wafer cassette of the first probe test apparatus viewed in the direction of the axis X.

When the cassette 6 is mounted at its correct position on the cassette-mounted stage 12, its positioning member 16 is engaged with the recess 18 to thereby position it relative to the stage 12, as shown in FIG. 6. Its one leg 15 is positioned outside the outer end face of the front member 17a this time while its other leg 15 also outside the outer end face of the rear member 17b. When it is mounted on the stage 12, wafers W in it can be kept horizontal.

Figure 5:
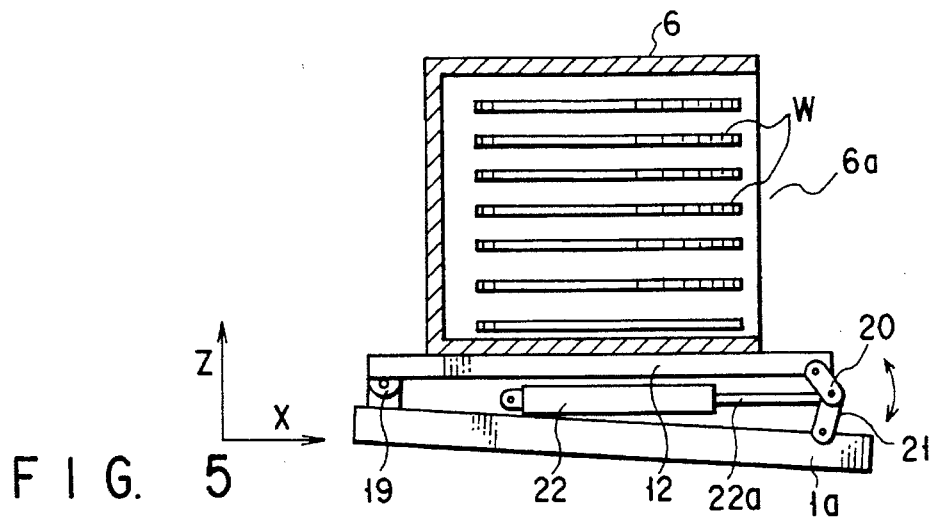
FIG. 5 is a perspective view showing the cassette-mounted stage and the wafer cassette of the first probe test apparatus viewed in the direction of the axis Y.

As shown in FIG. 5, the rear end portion of the stage 12 is supported by a frame 1a of the apparatus 1 through a hinge pin 19 while its front end portion also by the frame 1a of the apparatus 1 through a swing link 21. The swing link 21 is connected to a rod 22a of a solenoid 22 by a pin 20. When the rod 22a is retreated into the solenoid 22, the swing link 21 is swung to lift the front end portion of the cassette 6 a little, so that the stage 12 can be tilted relative to the horizontal plane. This prevents the wafers W in the cassette 6 from coming out of it through the opening 6a.

It will be described how the wafer cassette 6 is set in the above-described probe test apparatus.

The operator grips the handle 6b by his hand, lifts the cassette 6, puts it into the apparatus 1 through the opening 13a and mounts it on the stage 12. The wafers W to be tested are housed in it.

As shown by a two-dot and dash line in FIG. 6, the cassette 6 is pushed in a direction shown by an arrow while sliding its supports 15 and positioning member 16 on tops 17c of the holder members 17. When its positioning member 16 is fitted into the recess 18, as shown by a solid line in FIG. 6, it is stopped. When it is stopped in this manner, it can be positioned correctly relative to the stage 12. When it is at this position, legs 15 are positioned outside the holder members 17a and 17b.

According to the above-described apparatus 1, the operator can feel vibration and impact caused when the member 16 falls into the recess 18. Therefore, he can more easily position the cassette 6 relative to the stage 12 without confirming it by his eyes.

Figure 7:
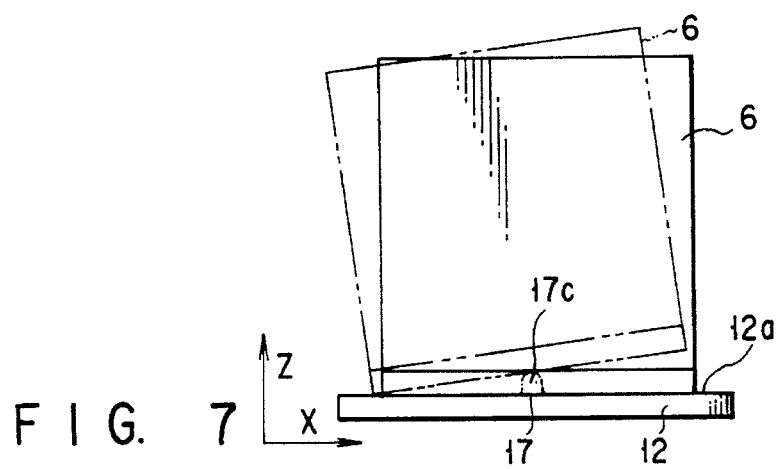
FIG. 7 is intended to explain how the wafer cassette is mounted on its stage.

When the cassette 6 is not set at its correct position on the stage 12, as shown by a two-dot and chain line in FIG. 7, it is tilted relative to the horizontal plane. Therefore, the operator can more easily know that the positioning of the cassette 6 is not correct.

The probe test apparatus according to a second embodiment of the present invention will be described with reference to FIGS. 8 through 10. Same components as those of the first embodiment will be mentioned only when needed.

Upper and lower cassette housing sections 30 and 31 which are located one upon the other are arranged on one side of the apparatus 1. The upper cassette housing section 30 is projected upward from the upper surface of the apparatus. It is covered by a curved smooth cover 33, which comprises a rear cover portion 33a and a front cover portion 33b. The rear cover portion 33a is fixed to the top of the apparatus. The front cover portion 33b is connected swingable to the rear one 33a by hinges 34. The upper cassette housing section 30 cannot be usually seen from outside because it is covered by the cover 33, as shown in FIG. 8. When the cassette 6 is to be taken into and out of it, however, the front cover portion 33b is swung up to expose it, as shown in FIG. 9.

On the other hand, the lower cassette housing section 31 is arranged in the apparatus 1. The cassette 6 in which plural semiconductor wafers W are arranged in the vertical direction with a certain interval interposed between adjacent ones is detachably supported on the cassette-mounted stage 12. The front side of the lower cassette housing section 31 is shielded by a cover door 37. The cover door 37 is intended to open and close a front opening 36 of the section 31 and it is connected to a side plate 8 by hinges 38. The cassette-mounted stage 12 of the slide drawer type is arranged adjacent to the lower rim of the opening 36. The lower cassette housing section 31 cannot be usually seen from outside, as shown in FIG. 8, because it is covered by the cover door 37. When the cassette 6 is to be taken into and out of it, however, the cover door 37 is swung downward to expose it, as shown in FIG. 10. When the stage 12 is then slid forward, the cassette 6 can be mounted on it. Flanges 37a are attached to three sides of the cover door 37 to make the section 31 air-tight when the cover door 37 closes it. A handle 35 is also attached to the front of the cover door 37 at the upper portion thereof. When the cover door 37 is swung upward to completely close the section 31, its upper half is projected a little more forward than its lower half.

Further, a rectangular opening 40 is formed between the upper 30 and the lower cassette housing section 31. It has a same width as those of the openings 32 and 36 but its height is by far smaller than those of them. A housing shelf 41 is arranged adjacent to the lower rim of it. A test wafer TW is housed in the shelf 41.

Figure 10:
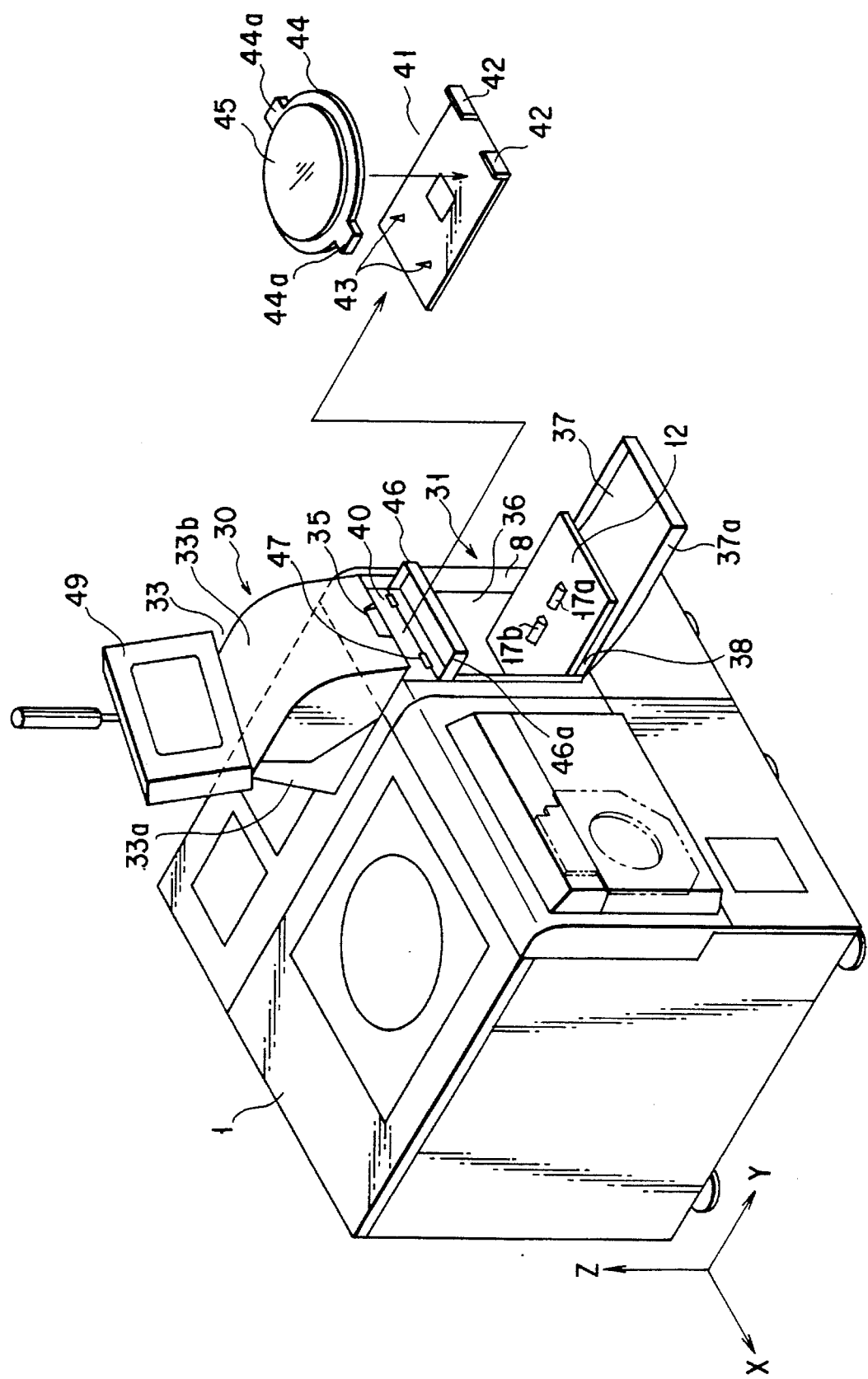
FIG. 10 is a perspective view showing the second probe test apparatus dismantled to explain how it is operated.

As shown in FIG. 10, the housing shelf 41 is a substantially square plate and a pair of finger hooks 42 are erected from the front rim of the plate. Two positioning pins 43 are projected upward from the top of the plate to position a test wafer 45 relative to a wafer tray 44. A door 46 is connected to the lower rim of the opening 40 to close and open it. When it is at open position, the door 46 is kept substantially horizontal. Side walls 46a are erected from both sides of the door 46 and when the door 46 is closed, it is projected a little forward from the side plate 8. A handle 48 is attached to the front of the door 46 at the upper portion thereof.

Each of the upper and lower cassette-mounted stages 12 has engaging members 17a and 17b substantially same as those of the first embodiment. Further, these upper and lower stages 12 and the test wafer housing shelf 41 can be moved up and down by a lifter unit (not shown) arranged in the apparatus 1. The cassette 6 in the upper cassette housing section 30 can be moved downward by the lifter unit to that level at which it is housed in the lower cassette housing section 31.

A display 49 is freely swingably attached to a pole (not shown) which is erected from the top of the apparatus 1. When the front cover 33b is opened and closed, therefore, the display 49 can be swung in a direction shown by an arrow in FIG. 9 not to interfere with the front cover 33b.

It will be described how the above-described probe test apparatus is operated.

The operator can grasp the handle 35 of the front cover 33b, swing it upward, mount the cassette 6 on the stage 12 in the upper housing section 30 and then close the front cover 33b.

On the other hand, he can grasp the handle 39 of the cover door 37, swing it downward, draw the cassette-mounted stage 12 forward and mount another cassette 6 on it. He can set the cassette 6 in the lower cassette housing section 31 this time without forcing him to take any unnatural pose.

Further, he can grasp the handle 48 of the housing shelf 41, draw the door 46 forward, put his fingers on the finger hooks 42, draw the wafer tray 44 forward and mount the test wafer TW on the wafer tray 44.

According to the above-described second apparatus, each of the cassette housing sections 30 and 31 can be made simpler in arrangement and the cassette can be more easily positioned at its correct area on the cassette-mounted stage. When it is not positioned correctly, it can be confirmed by eyes.

A third embodiment of the present invention will be described with reference to FIGS. 11 through 17.

Figure 11:
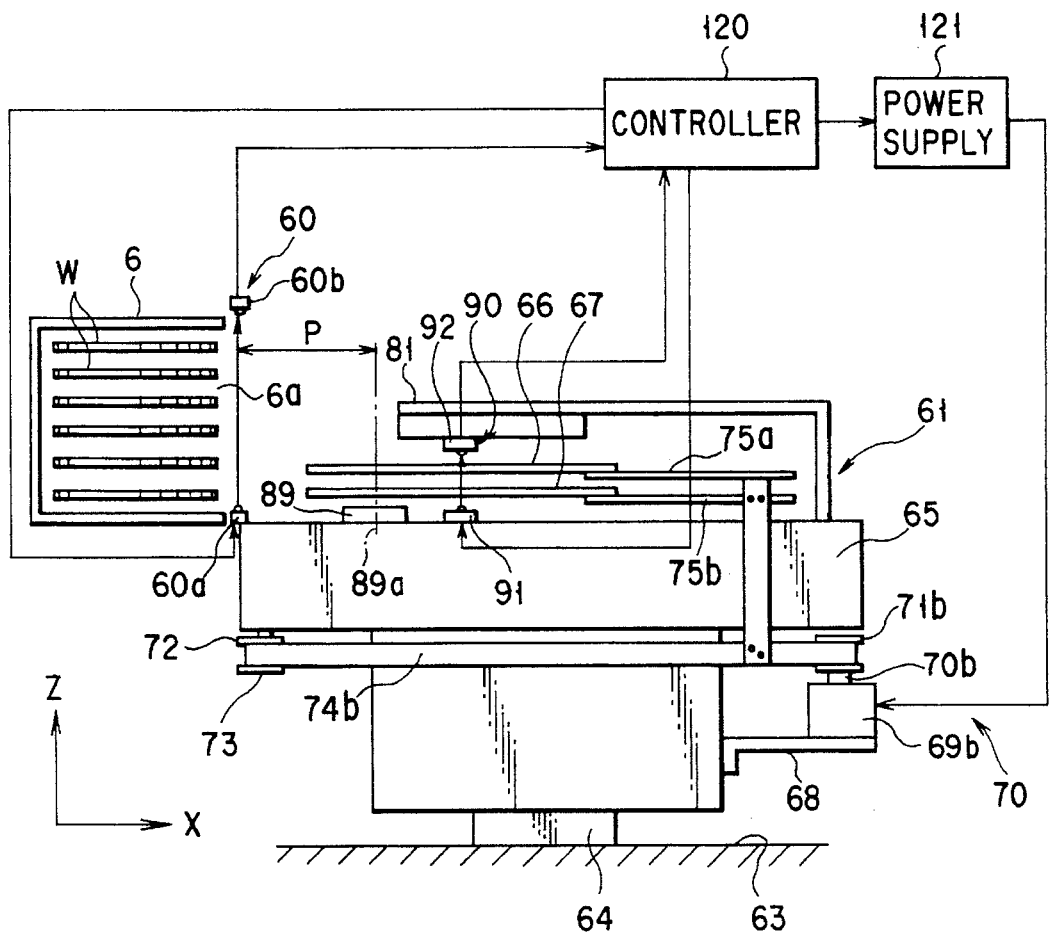
FIG. 11 is a block diagram showing the probe test apparatus according to a third embodiment of the present invention.

As shown in FIG. 11, a load/unload unit 61 of this probe test apparatus has two sensors 60 and 90. The first sensor 60 includes light-emitting and -receiving elements 60a and 60b connected to a controller 120. The light-emitting element 60a is arranged just before and below the opening 6a of the wafer cassette while the light-receiving element 6b just before and above it. Light beam emitted from the light-emitting element 6a to the light-receiving element 6b crosses the front of it to detect the wafer W coming out of the cassette 6.

A body 65 of the load/unload unit 61 is swingably supported by a base 63 through a main shaft 64. Upper and lower pincettes 66 and 67 are arranged horizontal above the body 65. They are moved forward and backward, independently of the other, along the axis X by a drive unit 70. The interval between them is larger than the width of the wafer W. The upper pincette 66 serves to load the wafer W into the cassette 6 while the lower one 67 to unload it from the cassette 6.

Figure 12:
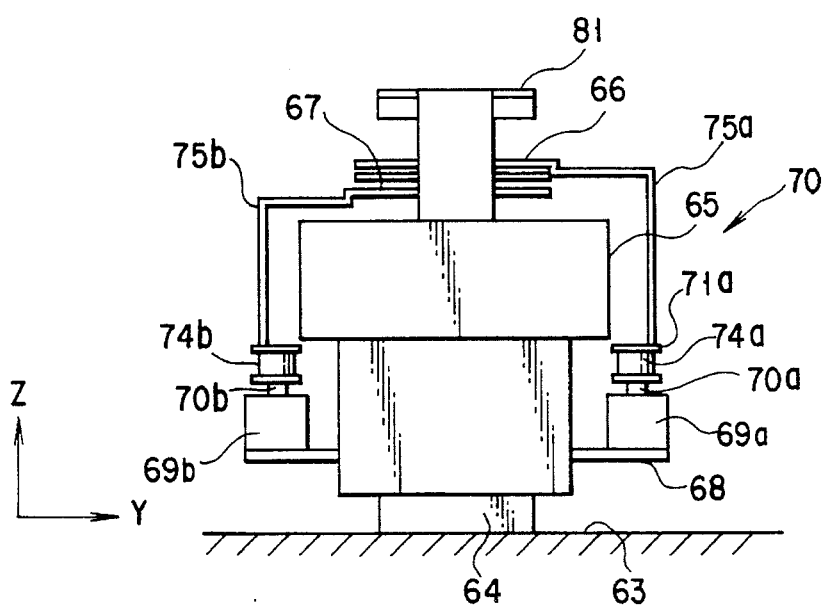
FIG. 12 shows the third probe test apparatus viewed in the direction of the axis X.

As shown in FIG. 12, a pair of brackets 68 are arranged on both sides of the body 65 and adjacent to the rear thereof, and motors 69a and 69b for the drive unit 70 are supported on them. The motors 69a and 69b are of the reversible stepping type. The motor 69a transmits its drive force to the upper pincette 66 through belt drive components 70a, 71a, 74a and 75a, while the motor 69b to the lower pincette 67 through belt drive components 70b, 71b, 74b and 75b.

Figure 13:
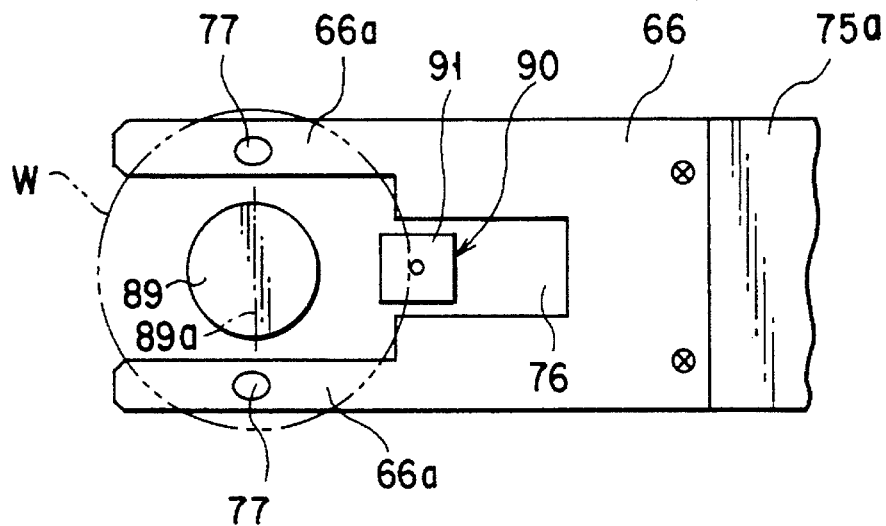
FIG. 13 is a plan view showing an alignment unit.

As shown in FIG. 13, the load pincette 66 is a rectangular plate made of synthetic resin, and it has a forked wafer support portion 66a at its front. The unload pincette 67 is substantially same as it. Vacuum suction holes 77 which are communicated with a vacuum suction pump (not shown) are formed in the wafer support portion 66a to suck and hold the wafer W. A cut-away portion 76 is also formed at the base of the pincette 66 to serve as a space through which light beam of the second sensor 90 passes.

Light-emitting and -receiving elements 91 and 92 of the second sensor 90 are arranged as follows: The light-emitting element 91 has four light-emitting points and the light-receiving element 92 has four light-receiving points. The first light-emitting point faces the first light-receiving point, the second light-emitting point the second light-receiving point, the third light-emitting point the third light-receiving point and the fourth light-emitting point the fourth light-receiving point. Optical axis extending from the first light-emitting point to the first light-receiving point is positioned to be shielded not by four-inch wafers W held by the pincettes 66 and 67 but by five-inch wafers w held. Optical axis extending from the second light-emitting point to the second light-receiving point is positioned to be shielded not by five-inch wafers W held but by six-inch wafers W held. Optical axis extending from the third light-emitting point to the third light-receiving point is positioned to be shielded not by six-inch wafers W held but by eight-inch wafers W held. Optical axis extending from the fourth light-emitting point to the fourth light-receiving point is positioned not to be shielded by eight-inch wafers W held. Four-, five-, six- and eight-inch wafers W can be confirmed, respectively, by this sensor 90.

An alignment unit 78 will be described with reference to FIGS. 14 through 17.

Figure 14:
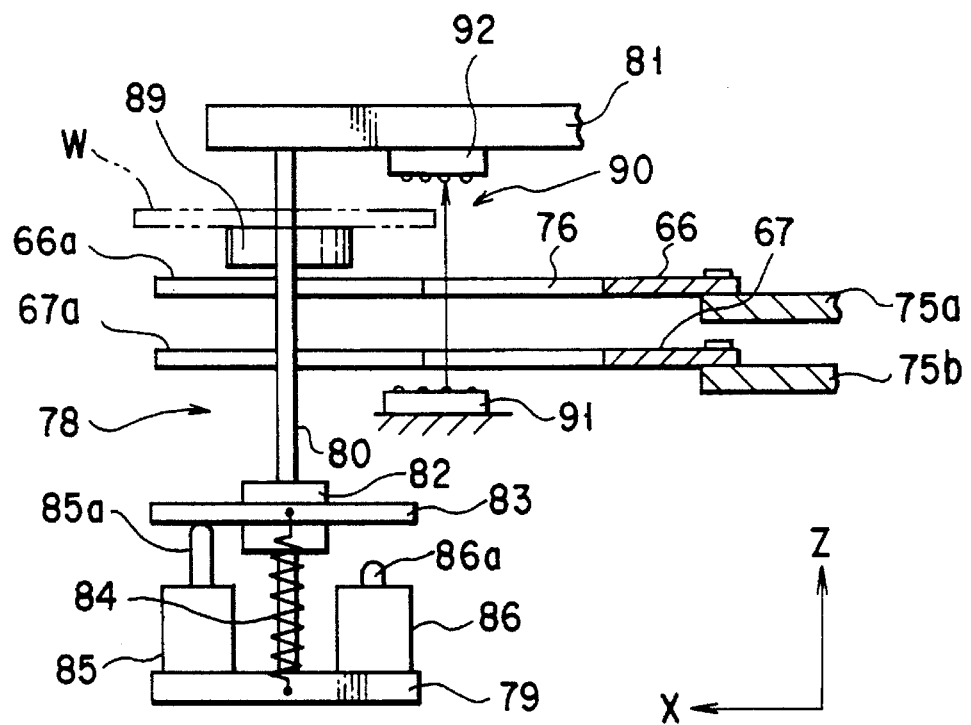
FIG. 14 shows the alignment unit viewed in the direction of the axis Y.

As shown in FIG. 14, the alignment unit 78 is arranged on the front side of the body 65 and at that position where the wafer support portions 66a and 67a are positioned when the pincettes are retreated. A guide post 80 of the alignment unit 78 is erected vertical between a base 79 and a fixed arm 81. A movable plate 83 can be slid along the guide post 80 through its fitted member 82. First and second cylinders 85 and 86 are arranged under the movable plate 83 and their first and second rods 85a and 86b serve to lift the movable plate 83 independently of the other. A tension spring 84 is attached to the underside of the movable plate 83 to urge the plate 83 to a base 79.

First and second cylinders 85 and 86 are supported at a same level by the common base 79. The stroke of the first cylinder 85 is larger than that of the second cylinder 86.

Figure 15:
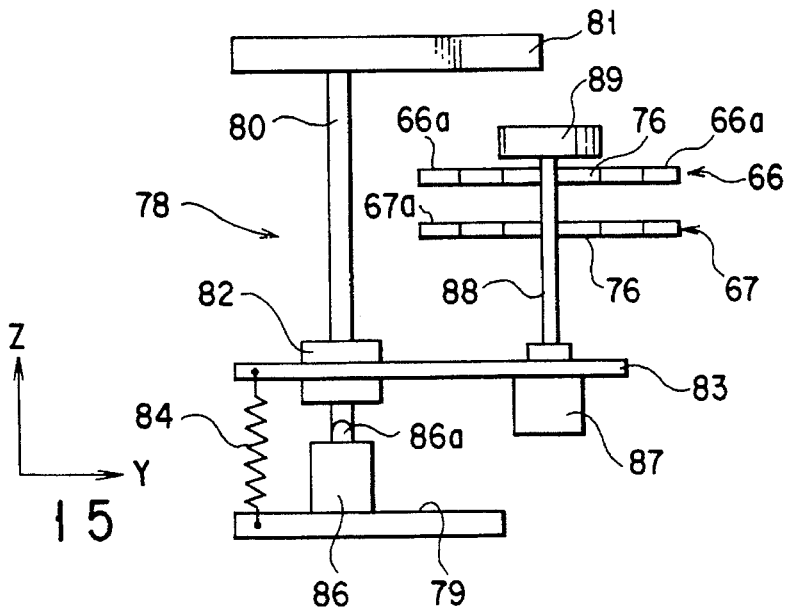
FIG. 15 shows the alignment unit viewed in the direction of the axis X.

As shown in FIG. 15, an alignment motor 87 is also attached to the movable plate 83. A drive shaft 88 of the motor 87 extends vertical in the direction Z and a disk-like alignment stage 89 is attached to the top of the shaft 88. The alignment stage 89 has a diameter smaller than the width of the cut-away portion 76 and it can pass through the cut-away portion 76 without interfering with the wafer support portions 66a and 67a.

Figure 16:
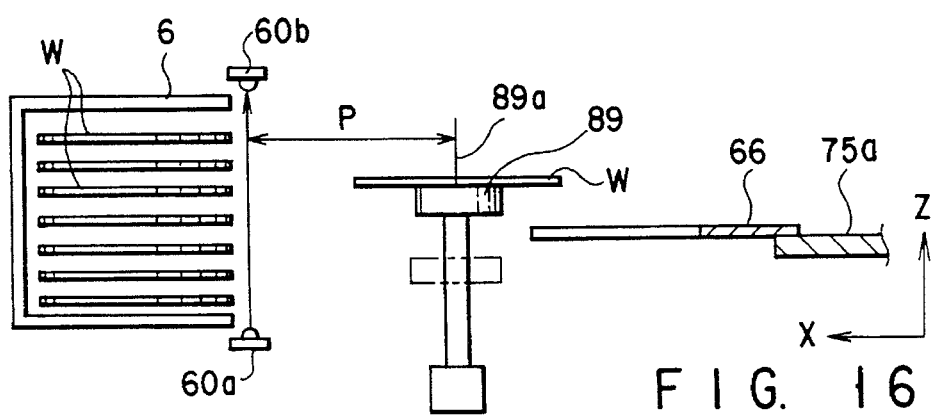
FIG. 16 shows how the alignment unit is positioned relative to the cassette.

As shown in FIG. 16, a predetermined distance P is set between a center shaft 89a of the alignment stage 89 and the optical axis of the first sensor 60. The load pincette 66 moves in the direction X at a certain speed V.

It will be described how the above-described third probe test apparatus is operated.

The motor 69a is driven forward to advance the load pincette 66. The front end portion 66a of the load pincette 66 is inserted into the cassette 6 and positioned just under the wafer W. The cassette 6 is lowered by one pitch which is equal to the interval between two adjacent wafers w in the cassette 6, and the wafer W is thus transferred onto the load pincette 66. The wafer W is then vacuum-sucked and held on the front end portion 66a of the load pincette 66. The motor 69a is driven backward to retreat the load pincette 66. The wafer W is thus taken out of the cassette 6.

Figure 17:
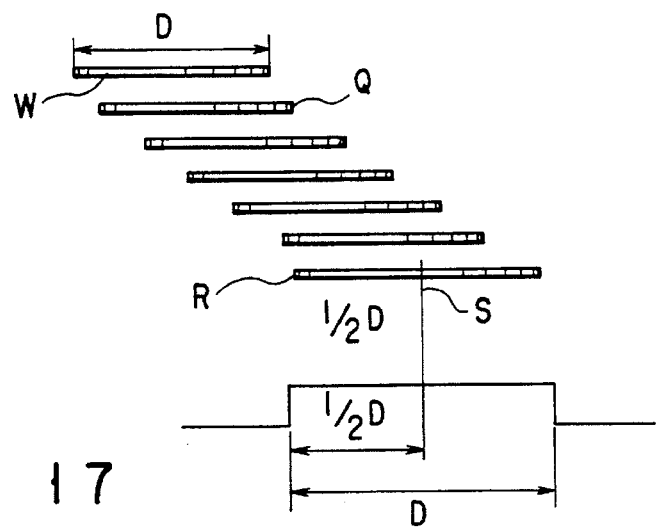
FIG. 17 shows how a sensor is positioned relative to the alignment unit and the cassette.

As shown in FIG. 17, the wafer W held begins to shield the beam light of the first sensor 60 at a wafer position Q (or position at which the wafer W starts its passing). The beam light of the first sensor 60 is not shielded by the wafer W held but begins to reach the light-receiving element 60b at a wafer position R (or position at which the wafer W finishes its passing). Light signal is thus sent from the light-receiving element 60b to the controller 120.

The controller 120 counts a time T during which the wafer W starts and finishes its light shielding. Further, it calculates a diameter D (=V×T) of the wafer W from the time T counted and the moving speed v of the pincette 66. Furthermore, it calculates a radius +e,fra 2+ee ×D of the wafer W to get a center position S of the wafer W. Still further, it calculates a distance {P−(½×D)} extending from the center position S to the center shaft 89a of the alignment stage and converts it to the rotation number of the motor 69a. It sends command signal to the power source 121 to move the load pincette 66 from the position R only by the distance {P−(½× D)}. The center of the wafer W is thus aligned with the center shaft 89a of the alignment stage to thereby finish the centering of the wafer W.

The wafer W is then released from its vacuum-sucked state and the first cylinder 85 of the alignment unit 78 is made operative to transfer the wafer W from the load pincette 66 onto the alignment stage 89. The alignment stage 89 is rotated to face the orientation flat of the wafer W in a desired direction. The wafer W is pre-aligned and its size is found by the second sensor 90. When its size is found in this manner, the moving stroke of the load pincette 66 can be controlled in the course of carrying it in and out.

When the pre-aligning of the wafer W and the finding of its size are finished, the first rod 85a is retreated into the first cylinder 85 to lower it. It is thus again transferred from the alignment stage 89 onto the load pincette 66.

The body 65 is rotated forward round the shaft 64 by 90° to face the front end portion of the body 65 to the wafer-mounted stage 3 on the main stage 2. The load pincette 66 is retreated. The probing test is applied to each semiconductor device (or chip) on the wafer W. Further, the controller 120 creates signal responsive to wafer size data stored and sends it to the drive system at the measuring area and the inker or to the memory for storing measuring results and to the optical system.

When the probing test is finished, the unload pincette 67 is moved forward to the wafer-mounted stage 3 to suck and hold the wafer W. It is then retreated to its rearmost position and the body 65 is rotated backward round the shaft 64 by 90°. The front end portion of the body 65 is thus faced the cassette 6.

The wafer W is the released from its vacuum-sucked state and the second cylinder 86 of the alignment unit 78 is made operative to transfer the wafer from the unload pincette 67 onto the alignment stage 89. The alignment stage 89 is rotated to face the orientation flat of the wafer W to the desired direction. After the pre-alignment, the wafer W is lowered and again transferred from the alignment stage 89 onto the unload pincette 67. It is vacuum-sucked and held by the unload pincette 67. Further, the unload pincette 67 is moved forward to return it into the cassette 6 and then retreated. One cycle of the process is thus finished.

According to the above-described apparatus, the wafer W can be pre-aligned and its size can be found in the course of taking it out of the cassette 6. This makes it unnecessary to use an additional shaft system for swinging the pincettes to find its size. In short, only one shaft system is needed to linearly move the pincettes forward and backward. This makes the apparatus simpler.

A fourth embodiment of the present invention will be described referring to FIGS. 18A through 18D.

Figure 18A:
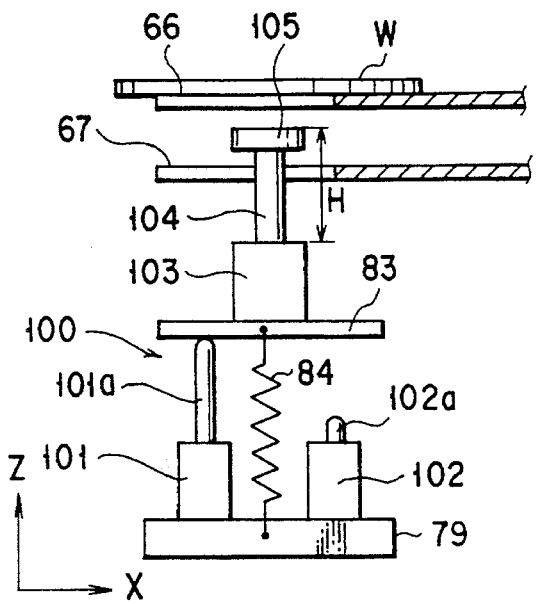
FIGS. 18A through 18D show the alignment unit viewed in the direction of the axis Y to explain how it is operated.

As shown in FIG. 18A, an alignment unit 100 has two cylinder mechanisms to lift the movable plate 83. The stroke of the first cylinder mechanism which comprises a cylinder 101 and a rod 101a is set 25 mm. The stroke of the second cylinder mechanism which comprises a cylinder 102 and a rod 102a is set 15 mm. Two-step stroke cylinder mechanisms 103 and 104 are arranged on the movable plate 83. An alignment stage 105 is attached to the top of the rod 104 to vacuum-suck and hold the wafer W on it.

It will be described how the alignment unit 100 of the fourth embodiment is operated.

When the wafer W to be tested is to be aligned, the rod 101a is projected from the first cylinder 101 at high speed by 25 mm to lift the movable plate 83, as shown in FIG. 18A. The alignment stage 105 is positioned this time at a level H.

Figure 18B:
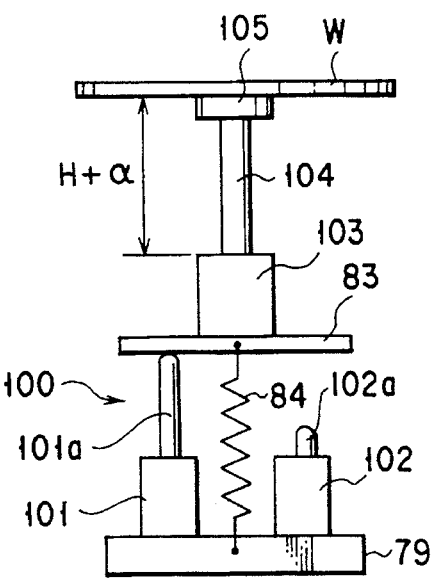

When the rod 104 is then projected from the two-step stroke cylinder 103 at low speed to lift the alignment stage 105 to a level (H+α), as shown in FIG. 18B, the wafer W is transferred from the load pincette 66 onto the alignment stage 105. The wafer W is pre-aligned.

When the alignment stage 105 is lowered to the level H after the pre-alignment, as shown in FIG. 18A, the wafer W is transferred from alignment stage 105 onto the load pincette 66.

Figure 18C:
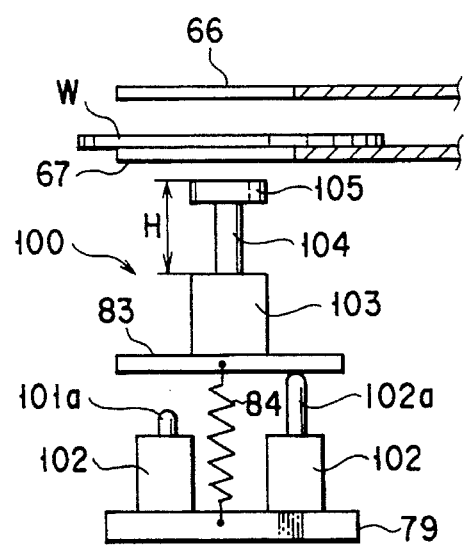
Figure 18D:
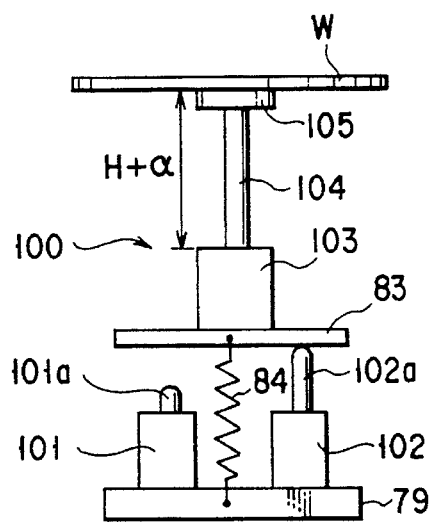

When the wafer W which has been tested is to be aligned, the rod 102a is projected from the second cylinder 102 at high speed by 15 mm to lift the movable plate 83, as shown in FIG. 18C. When the rod 104 is then projected from the two-step stroke cylinder 103 at low speed to lift the alignment stage 105 to the level (H+a), as shown in FIG. 18D, the wafer W is transferred from the unload pincette 67 onto the alignment stage 105.

When the alignment stage 105 is lowered to the level H after the pre-alignment, as shown in FIG. 18C, the wafer W is transferred from the alignment stage 105 onto the unload pincette 67.

According to the above-described embodiment, the rod 104 is lifted at low speed by the two-step stroke cylinder 103. Therefore, force with which the alignment stage 105 is struck against the wafer W can be made smaller to thereby prevent the wafer W from being damaged.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A probe test apparatus comprising:

a test section for testing a substrate;

a cassette having an opening at one side through which the substrate is taken into and out of the cassette, grooves formed in inner faces of both sides of the cassette to hold substrates therein, and a convex portion projected downward from an underside of the cassette;

a stage on which the cassette is mounted keeping the substrates therein substantially horizontal; and holder means having plural projection members projecting upward from a top of the cassette-mounted stage and forming a recess into which the convex portion of the cassette falls, each of said projection members having a curved smooth guide top and extending such that, when the cassette is moved along the projection members while keeping said convex portion in contact with said guide top, the convex portion of the cassette falls in said recess, wherein when the convex portion is not fitted into the recess but contacted with the projection members, substrates in the cassette are tilted, and when the convex portion falls in the recess, the substrates are kept substantially horizontal in the cassette to thereby position the cassette relative to the test section.

2. The probe test apparatus according to claim 1, wherein the projection member extends on the center line of the cassette-mounted stage, when viewed in the width direction of the stage, and along a direction in which the cassette is moved.

3. The probe test apparatus according to claim 1, further comprising means for tilting the cassette-mounted stage to tilt the opening of the mounted cassette upward.

4. The probe test apparatus according to claim 1, wherein the cassette has legs for supporting it and the legs include the convex portion.

5. The probe test apparatus according to claim 1, wherein the projection member has a round top.

6. The probe test apparatus according to claim 1, wherein each of the convex portions extends from an end to the other opposite end of the cassette.

7. The probe test apparatus according to claim 1, wherein the holder plural projection members includes first and second members arranged in series and separated from each other and the recess is formed between the first and the second member.

8. The probe test apparatus according to claim 7, wherein the convex portions are three parallel rectangular rods and an interval $L_2$ between adjacent ones is made longer than a length $L_1$ of each of the first and second members.

9. A probe test apparatus comprising:

a test section for testing a substrate;

load means for taking the substrate, which is to be tested, out of a cassette;

a sensor having an optical axis crossing a space through which the substrate taken out by the load means passes;

calculating means for calculating the size of the substrate responsive to light detection signal applied from the sensor;

alignment means for positioning the substrate relative to the test section on the basis of the substrate size calculated; and unload means for returning the substrate, which has been tested, from the test section into the cassette.

10. The probe test apparatus according to claim 9, wherein the sensor has light-emitting and -receiving elements, which are arranged adjacent to the alignment means.

11. The probe test apparatus according to claim 9, wherein the load means has a first arm for supporting the substrate, the unload means has a second arm for supporting the substrate, and each of the first and second arms has a cut-away portion not to shield the optical axis of the sensor.

12. The probe test apparatus according to claim 11, wherein the first arm is arranged above the second one.

13. The probe test apparatus according to claim 9, wherein the sensor has plural light-emitting and -receiving elements and it also has means for changing over light beam emitted from each of the light-emitting elements.

14. The probe test apparatus according to claim 9, wherein the load means carries the substrate at a certain speed.

15. The probe test apparatus according to claim 9, wherein the load means has a first belt drive mechanism and the unload means has a second belt drive mechanism.

16. The probe test apparatus according to claim 15, wherein the first belt drive mechanism is driven independently of the second belt drive mechanism.

17. The probe test apparatus according to claim 9, further comprising a second sensor provided with an optical axis crossing just before the cassette opening, through which the substrate is taken into and out of the cassette, to detect the substrate coming out of the cassette.

18. A probe test apparatus comprising:

a test section for testing a substrate;

load means for taking the substrate, which is to be tested, out of a cassette;

a first sensor having an optical axis crossing a space through which the substrate taken out by the load means passes;

operational means for calculating the size of the substrate responsive to light detection signal applied from the first sensor;

alignment means for positioning the substrate relative to the test section on the basis of the substrate size calculated;

unload means for returning the substrate, which has been tested, from the test section into the cassette; and a second sensor having an optical axis crossing just before the cassette opening, through which the substrate is loaded into and unloaded from the cassette, to detect any of the substrate coming out of the cassette.

19. The probe test apparatus according to claim 18, wherein an interval P between the optical axis of the second sensor and the center of the alignment means is made certain, the load means carries the substrate at a certain speed v, and the operational means counts a time T during which the substrate taken out of the cassette crosses over the optical axis of the second sensor and aligns the center of the substrate with that of the alignment means on the basis of the counted time T, the carrying speed v and the interval P.

* * * * *